US012775516B2

(12) United States Patent
Park et al.

(10) Patent No.: US 12,775,516 B2
(45) Date of Patent: Oct. 27, 2026

(54) STORAGE DEVICE PERFORMING RECOVERY OPERATION IN CONSIDERATION OF A CORRELATION BETWEEN VARIABLES RELATED TO ENDURANCE OF A NON-VOLATILE MEMORY DEVICE AND OPERATION METHOD THEREOF

(71) Applicant: SAMSUNG ELECTRONICS CO., LTD., Suwon-si (KR)

(72) Inventors: Snghoon Park, Suwon-si (KR); Juyeon Park, Suwon-si (KR); Jisung Byun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/962,959

(22) Filed: Nov. 27, 2024

(65) Prior Publication Data

US 2025/0272186 A1 Aug. 28, 2025

(30) Foreign Application Priority Data

Feb. 22, 2024 (KR) ........................ 10-2024-0025615

(51) Int. Cl.

| | |
|---|---|
| ***G06F 11/34*** | (2006.01) |
| ***G06F 11/07*** | (2006.01) |
| *G06F 11/10* | (2006.01) |
| *G11C 16/34* | (2006.01) |

(52) U.S. Cl.

CPC ...... *G06F 11/0793* (2013.01); *G06F 11/0727* (2013.01); *G06F 11/1068* (2013.01); *G06F 2212/7211* (2013.01); *G11C 16/3495* (2013.01)

(58) Field of Classification Search

CPC ............. G06F 11/1068; G06F 11/0727; G06F 11/0793; G06F 3/0653; G06F 3/0679; G06F 3/0616; G11C 16/3495

See application file for complete search history.

(56) References Cited

U.S. PATENT DOCUMENTS

| | | | |
|---|---|---|---|
| 9,268,487 | B2 | 2/2016 | Gibbons et al. |
| 9,329,797 | B2 | 5/2016 | Darragh et al. |
| 9,875,813 | B2 | 1/2018 | Ryan et al. |
| 9,965,005 | B2 | 5/2018 | Kim et al. |
| 10,453,543 | B2 | 10/2019 | Jean |
| 10,475,519 | B2 | 11/2019 | Parry et al. |

(Continued)

FOREIGN PATENT DOCUMENTS

| | | |
|---|---|---|
| KR | 10-2529171 B1 | 5/2023 |

*Primary Examiner* — Joseph O Schell

(74) *Attorney, Agent, or Firm* — Sughrue Mion, PLLC

(57) ABSTRACT

Provided is an operating method of a storage controller configured to communicate with a non-volatile memory device. The operating method includes receiving a memory response from the non-volatile memory device, generating a first value of a first endurance type and a second value of a second endurance type, based on the memory response, obtaining a third value by applying the first value to a threshold function, the threshold function being defined based on a correlation between the first endurance type and the second endurance type, determining whether the second value is greater than or equal to the third value, and performing a recovery operation in response to determining that the second value is greater than or equal to the third value.

20 Claims, 16 Drawing Sheets

(56) References Cited

U.S. PATENT DOCUMENTS

| | | | | |
|---|---|---|---|---|
| 11,409,441 | B2 | 8/2022 | Kim et al. | |
| 2007/0266200 | A1* | 11/2007 | Gorobets | G06F 11/008 714/E11.02 |
| 2008/0082725 | A1* | 4/2008 | Elhamias | G11C 29/76 711/E12.008 |
| 2016/0041760 | A1* | 2/2016 | Kuang | G11C 16/3495 711/103 |
| 2017/0131947 | A1* | 5/2017 | Hoang | G06F 11/00 |
| 2021/0109660 | A1* | 4/2021 | Kim | G06F 11/1068 |
| 2022/0147252 | A1* | 5/2022 | Liu | G06F 9/4401 |
| 2024/0160370 | A1* | 5/2024 | Horak | G06F 3/0679 |

* cited by examiner

FIG. 7

| Endurance Data | | Threshold Function | | Decision results |
|---|---|---|---|---|
| ET1 | ET2 | x | f(x) | |
| x1 | y1 | x1 | f(x1) | Normal(y1 < f(x1)) |
| x2 | y2 | x2 | f(x2) | Normal(y2 < f(x2)) |
| ⋮ | ⋮ | ⋮ | ⋮ | ⋮ |
| $x_k$ | $y_k$ | $x_k$ | $f(x_k)$ | Abnormal($y_k \geq f(x_k)$) |

FIG. 8A

1st Policy Table

| Endurance Data | | Risk Level ($y_k - f(x_k)$) | Recovery Action |
|---|---|---|---|
| ET1 | ET2 | | |
| time | EC | 2 (> Th1) | Operation stop & Report |
| time | EC | 1 (otherwise) | Restrict operation (Read Only) |

FIG. 8B

2nd Policy Table

| Endurance Data | | Risk Level ($y_k - f(x_k)$) | Recovery Action |
|---|---|---|---|
| ET1 | ET2 | | |
| time | RC | 2> (Th2) | Operation stop & Report |
| time | RC | 1 (otherwise) | Reset read levels |

FIG. 8C

3rd Policy Table

| Endurance Data | | Risk Level ($y_k - f(x_k)$) | Recovery Action |
|---|---|---|---|
| ET1 | ET2 | | |
| EC or RC | Reclaim | 2 (> Th3) | Operation stop & Report |
| EC or RC | Reclaim | 1 (otherwise) | Restrict operation (Read Only) |

FIG. 8D

4th Policy Table

| Endurance Data | | Risk Level ($y_k - f(x_k)$) | Recovery Action |
|---|---|---|---|
| ET1 | ET2 | | |
| EC or RC | P/E Fail | 2 (> Th4) | Operation stop & Report |
| EC or RC | P/E Fail | 1 (otherwise) | Restrict operation (Read Only) |

FIG. 8E

5th Policy Table

| Endurance Data | | Risk Level ($y_k - f(x_k)$) | Recovery Action |
| --- | --- | --- | --- |
| ET1 | ET2 | | |
| EC or RC | Error Correct | 2 (> Th5) | Operation stop & Report |
| EC or RC | Error Correct | 1 (otherwise) | Restrict operation (Read Only) |

FIG. 8F

6th Policy Table

| Endurance Data | | Risk Level $(y_k - f(x_k))$ | Recovery Action |
|---|---|---|---|
| ET1 | ET2 | | |
| EC or RC | RTBB | 2 (> Th6) | Operation stop & Report |
| EC or RC | RTBB | 1 (otherwise) | Restrict operation (Read Only) |

STORAGE DEVICE PERFORMING RECOVERY OPERATION IN CONSIDERATION OF A CORRELATION BETWEEN VARIABLES RELATED TO ENDURANCE OF A NON-VOLATILE MEMORY DEVICE AND OPERATION METHOD THEREOF

CROSS-REFERENCE TO RELATED APPLICATION

This application claims priority under 35 U.S.C. § 119 to Korean Patent Application No. 10-2024-0025615 filed on Feb. 22, 2024, in the Korean Intellectual Property Office, the disclosure of which is herein incorporated by reference in its entirety.

BACKGROUND

Example embodiments of the present disclosure described herein relate to a storage device, and more particularly, relate to a storage device performing a recovery operation by using endurance data and an operation method thereof.

A memory device stores data in response to a write request and outputs data stored therein in response to a read request. For example, the memory device is classified as a volatile memory device, which loses data stored therein when a power is turned off, such as a dynamic random access memory (DRAM) device or a static RAM (SRAM) device, or a non-volatile memory device, which retains data stored therein even when a power is turned off, such as a flash memory device, a phase-change RAM (PRAM), a magnetic RAM (MRAM), or a resistive RAM (RRAM).

The endurance of the non-volatile memory device may be damaged due to various factors such as an increase in an erase count and a read count by a threshold voltage distribution change and an increase in a number of bad blocks. There is a need for a method of capable of preemptively preventing a damage to endurance of the non-volatile memory when the erase count, the read count, etc. increase during a short time.

SUMMARY

Example embodiments of the present disclosure provide a storage device performing a recovery operation by using endurance data and an operation method thereof.

According to an embodiment, an operating method of a storage controller configured to communicate with a non-volatile memory device includes receiving a memory response from a non-volatile memory device; generating a first value of a first endurance type and a second value of a second endurance type, based on the memory response, the first endurance type and the second endurance type being related to an endurance of the non-volatile memory device; obtaining a third value by applying the first value to a threshold function, the threshold function being defined based on a correlation between the first endurance type and the second endurance type; determining whether the second value is greater than or equal to the third value; and performing a recovery operation in response to determining that the second value is greater than or equal to the third value.

According to an embodiment, an operating method of a storage controller configured to communicate with a non-volatile memory device includes receiving a memory response from a non-volatile memory device; generating a first value of a first endurance type, a second value of a second endurance type, and a third value of a third endurance type, based on the memory response, the first endurance type, the second endurance type, and the third endurance type being related to an endurance of the non-volatile memory device; obtaining a fourth value by applying the first value to a first threshold function, wherein the first threshold function is defined based on a correlation between the first endurance type and the second endurance type; obtaining a fifth value by applying the first value to a second threshold function, wherein the second threshold function is defined based on a correlation between the first endurance type and the third endurance type; and performing a recovery operation, based on at least one of determining that the second value is greater than or equal to the fourth value or determining that the third value is greater than or equal to the fifth value.

According to an embodiment, a storage device includes a non-volatile memory device, and a storage controller. The storage controller includes a monitoring manager configured to receive a memory response from a non-volatile memory device, generate a first value of a first endurance type and a second value of a second endurance type based on the memory response, obtain a third value by applying the first value to a threshold function, and generate a recovery request signal in response to determining that the second value is greater than or equal to the third value; and a recovery manager configured to perform a recovery operation in response to the recovery request signal. The first endurance type and the second endurance type may be related to an endurance of the non-volatile memory device, and the threshold function may be defined based on a correlation between the first endurance type and the second endurance type.

BRIEF DESCRIPTION OF DRAWINGS

The above and other objects and features of the present disclosure will become apparent by describing in detail certain example embodiments thereof with reference to the accompanying drawings.

FIG. 7 is a table describing a threshold function and endurance data according to one or more example embodiments of the present disclosure.

FIGS. 8A to 8F are tables illustrating a policy table of FIG. 5.

DETAILED DESCRIPTION

Below, example embodiments of the present disclosure will be described in detail and clearly to such an extent that one skilled in the art carries out example embodiments of the present disclosure easily.

Figure 1:
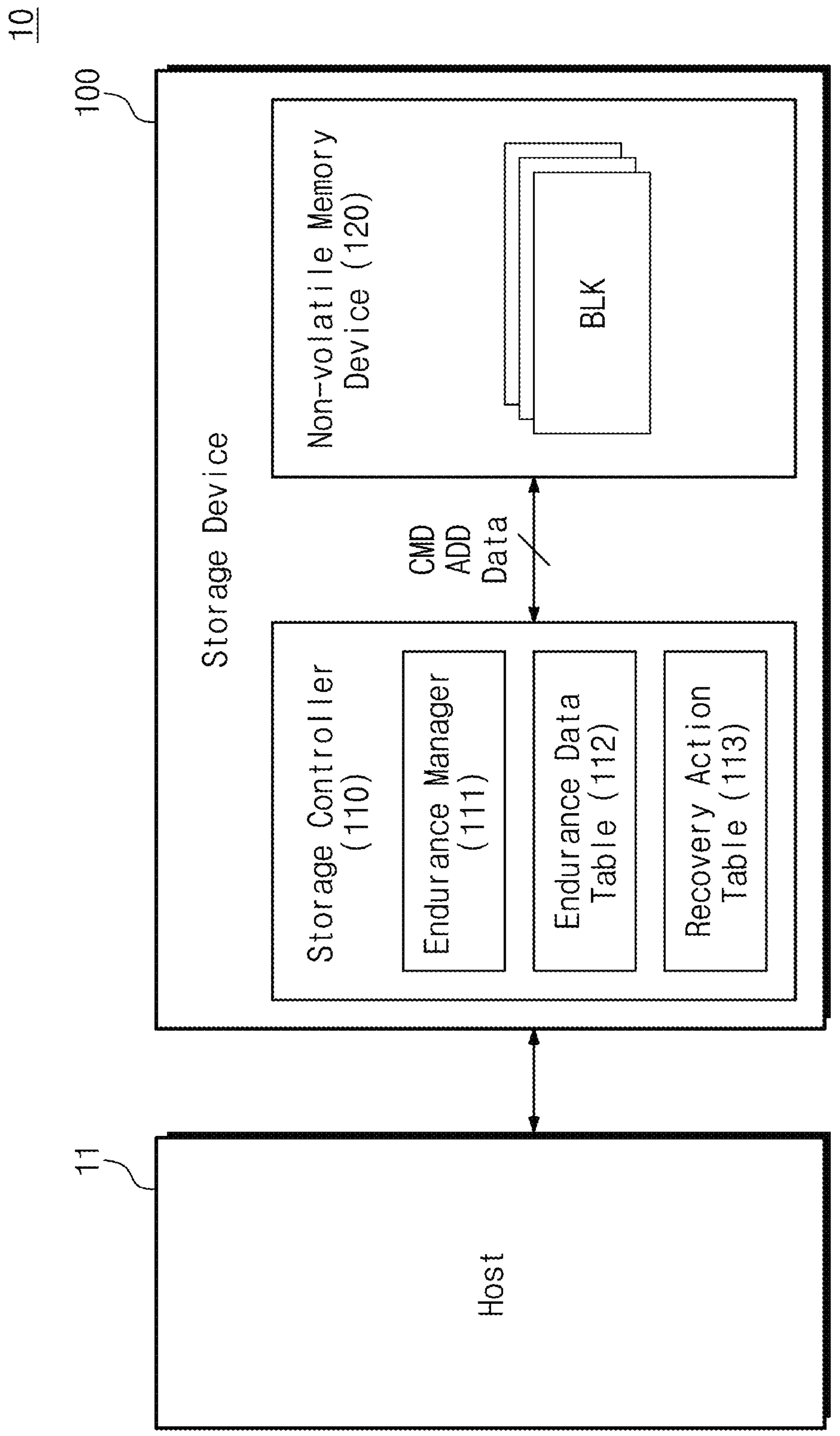
FIG. 1 is a block diagram of a storage device according to one or more example embodiments of the present disclosure.

FIG. 1 is a block diagram of a storage system according to an embodiment of the present disclosure. Referring to FIG. 1, a storage system 10 may include a host 11 and a storage device 100. In some embodiments, the storage system 10 may refer to a computing system, which is configured to process a variety of information, such as a personal computer (PC), a notebook, a laptop, a server, a workstation, a tablet PC, a smartphone, a digital camera, and a black box.

The host 11 may control all the operations of the storage system 10. For example, the host 11 may store data in the storage device 100 or may read data stored in the storage device 100.

The storage device 100 may include a storage controller 110 and a non-volatile memory device 120. The non-volatile memory device 120 may store data. The storage controller 110 may store data in the non-volatile memory device 120 or may read data stored in the non-volatile memory device 120. The non-volatile memory device 120 may operate under control of the storage controller 110. For example, based on a command CMD indicating an operation and an address ADD indicating a location of data, the storage controller 110 may store the data in the non-volatile memory device 120 or may read the data stored in the non-volatile memory device 120.

The non-volatile memory device 120 may include a plurality of memory blocks BLK. Each of the plurality of memory blocks BLK may include a plurality of memory cells. The plurality of memory cells may store data.

In some embodiments, the non-volatile memory device 120 may be a NAND flash memory device, but the present disclosure is not limited thereto. For example, the non-volatile memory device 120 may be one of various storage devices, which retain data stored therein even when a power is turned off, such as a phase-change random access memory (PRAM), a magnetic random access memory (MRAM), a resistive random access memory (RRAM), and a ferroelectric random access memory (FRAM).

The storage controller 110 may include an endurance manager 111, an endurance data table 112, and a recovery action table 113.

The endurance manager 111 may generate endurance data by monitoring endurance of the non-volatile memory device 120 and may perform a recovery operation.

The endurance manager 111 may monitor the non-volatile memory device 120 to receive a memory response. The memory response may indicate a result of a memory operation performed by the non-volatile memory device 120. For example, the memory operation may indicate at least one of a read operation of reading data stored in the non-volatile memory device 120, an erase operation of deleting data stored in the non-volatile memory device 120, a write operation of storing data in the non-volatile memory device 120, etc. The memory response may include the read data corresponding to the read operation, information about whether a program corresponding to the write operation succeeds, information about whether an erase corresponding to the erase operation succeeds, etc.

The endurance manager 111 may generate the endurance data by using the memory response. The endurance data may include a plurality of endurance types and a value of each of the plurality of endurance types. Each of the plurality of endurance types may indicate a variable (or event) affecting the endurance or a variable affected by the endurance. The endurance may indicate, for example, how many program/erase cycles the non-volatile memory device 120 may endure. The endurance may be associated with a lifetime of the non-volatile memory device 120.

In some embodiments, an endurance type may be one of the following for each memory block: an erase count, a read count, a program count, a reclaim count, a number of times of execution of an error correction code, an error correction success step, a number of bad blocks, a program fail count, an erase fail count, and a time. However, the present disclosure is not limited thereto. For example, kinds of the endurance type may increase or decrease depending on settings of the user or a design.

A reclaim may refer to an operation of again writing data stored in memory cells of the non-volatile memory device 120 in any other memory cells to guarantee reliability of data. For example, the storage controller 110 may perform a read operation on target data of a first memory block determined as requiring a read reclaim, may perform a write operation of writing the target data in a second memory block, and may perform an erase operation on the first memory block. In this case, the read operation may be based on an optimized read voltage level.

The error correction code (ECC) may refer to an algorithm which detects an error present in the read data read from the non-volatile memory device 120 and corrects the error. For example, an error may occur in the read data when threshold voltage distributions of the memory cells of the non-volatile memory device 120 change or when a leakage current occurs. The number of times of execution of the error correction code may indicate a number of times an error is determined to be present in the read data and the error is corrected.

The error correction success step may indicate a step, in which the error correction succeeds, from among a plurality of recovery steps included in a recovery algorithm. The recovery algorithm may indicate an algorithm defined in advance to be executed by the storage system 10 when an uncorrectable error occurs. The recovery algorithm may sequentially perform the plurality of recovery steps, and when the error correction succeeds, the recovery algorithm may not perform the following (or the remaining) recovery steps. The uncorrectable error may occur when threshold voltage distributions of memory cells change.

The bad block may be a run-time bad block. The bad block refers to a memory block which is determined as being impossible to perform the normal operation. The run-time bad block among bad blocks means a bad block which occurs while the non-volatile memory device 120 operates, not a bad block which occurs in a process of manufacturing the non-volatile memory device 120. For example, when an error is incapable of being corrected even by an error correction algorithm or the recovery algorithm, the storage controller 110 may classify the corresponding memory block as a bad block and may not perform an operation on the corresponding memory block any more.

The program failure may indicate that the program operation performed by the non-volatile memory device 120 fails. In this case, the non-volatile memory device 120 may provide the storage controller 110 with the memory response indicating the failure of the program operation.

The erase failure may indicate that the erase operation performed by the non-volatile memory device 120 fails. In this case, the non-volatile memory device 120 may provide the storage controller 110 with the memory response indicating the failure of the erase operation.

The time may indicate a system time (or a system clock) which is used in the storage system 10.

The recovery operation may indicate a preventive operation or a recovery operation for suppressing the reduction of endurance of the non-volatile memory device 120. The reduction of endurance of the non-volatile memory device 120 may be caused by an abnormal increase in the erase count or the read count. A phenomenon such as the abnormal increase in the erase count or the read count may be caused by a setting error of a storage device, a change in threshold voltage distributions of memory cells, etc.

In some embodiments, the recovery operation may be an operation of limiting the non-volatile memory device 120 such that only a restricted operation (e.g., a read operation) is performed or an operation of reporting a situation to the host 11 in a state where the operation of a storage controller stops.

The endurance manager 111 may determine the recovery operation in consideration of the endurance data and at least one threshold function. The threshold function may be a function which is defined based on a correlation between two endurance types among the plurality of endurance types. The threshold function may be defined in advance.

In some embodiments, the threshold function may indicate an expected correlation between two different endurance types among the plurality of endurance types of the storage system 10. The expected correlation may indicate a correlation between two different endurance types which a normal storage system 10 (or the storage system 10 whose endurance is not damaged) is expected to have.

In other words, the threshold function may indicate a tendency associated with the endurance types of the storage system 10. For example, the threshold function may indicate the tendency of the increase in the reclaim count according to the erase count, or the number of times of execution of an error correction code according to the erase count.

The threshold function may be a function determined in advance. For example, the threshold function may be determined based on a machine learning model trained by using a large amount of data sets associated with the plurality of endurance types. The endurance manager 111 may store at least one threshold function.

The endurance manager 111 may determine the recovery operation in consideration of the endurance data and at least one threshold function corresponding to the endurance data.

First, the endurance manager 111 may determine whether the recovery operation is required, based on a first comparison operation of the endurance data and at least one threshold function corresponding to the endurance data.

For example, when the endurance data include a first value of a first endurance type and a second value of a second endurance type, a first threshold function corresponding to the endurance data is defined based on a correlation between the first endurance type and the second endurance type. The endurance manager 111 may obtain a third value by applying the first value of the first threshold function. The endurance manager 111 may compare the second value of the second endurance type and the third value, and when the second value is greater than or equal to the third value, the endurance manager 111 may determine that the recovery operation is required.

The endurance manager 111 may determine the recovery operation based on a first comparison result of the first comparison operation. For example, the first comparison result may include a difference value between the second value of the second endurance type and the third value obtained from the first threshold function. As the difference value becomes greater, the risk that the endurance of the non-volatile memory device 120 is damaged may become higher.

The endurance manager 111 may determine the recovery operation based on a second comparison operation of the difference value of the first comparison operation and a threshold value. The threshold value which is a value determined in advance may be determined depending on the first and second endurance types.

For example, when the difference value of the first comparison result is greater than the threshold value, the endurance manager 111 may determine to perform a strong recovery action as the recovery operation. The endurance manager 111 may stop all operations of the non-volatile memory device 120 and may provide a report to the host 11. In contrast, when the difference value of the first comparison result is smaller than or equal to the threshold value, the endurance manager 111 may determine to perform a weak recovery action as the recovery operation. The endurance manager 111 may manage the non-volatile memory device 120 such that only a restricted operation (e.g., a read operation) is performed.

The endurance data table 112 may include the plurality of endurance types and the values of the plurality of endurance types. The endurance data table 112 may be updated by the endurance manager 111.

In some embodiments, when a response is received from the non-volatile memory device 120, the endurance manager 111 may generate the endurance data based on the received response by referring to the endurance data table 112.

For example, the endurance manager 111 may obtain existing endurance data by referring to the endurance data table 112. The existing endurance data may indicate the endurance data of the non-volatile memory device 120 before at least one operation corresponding to the response is performed. The endurance manager 111 may update the existing endurance data, based on the response received from the non-volatile memory device 120. The updated endurance data may correspond to the above endurance data, that is, the endurance data that is used to determine whether the recovery operation is required.

In detail, when the response received from the non-volatile memory device 120 corresponds to one or more endurance types, the endurance manager 111 may update a value of each of the one or more endurance types corresponding to the response. For example, when the response corresponds to a first endurance type having a value of "n" and corresponds to a second endurance type having a value of "m", the endurance manager 111 may generate a value obtained by adding "n" to a first existing value of the first endurance type included in the existing endurance data as a first value of the first endurance type of the updated endurance data. The endurance manager 111 may generate a value obtained by adding "m" to a second existing value of the second endurance type included in the existing endurance data as a second value of the second endurance type of the updated endurance data.

In this case, the endurance manager 111 may generate a value of each of endurance types, whose values are not changed in the existing endurance data, as a value of the endurance data without modification.

The endurance manager 111 may update the endurance data table 112, based on the updated endurance data.

The recovery action table 113 may include a plurality of policy tables. Each of the plurality of policy tables may correspond to a combination of two different endurance types. For example, a first policy table may correspond to a combination of a first endurance type and a second endurance type, and a second policy table may correspond to a combination of the second endurance type and a third endurance type.

Each of the plurality of policy tables may include a combination of corresponding endurance types, a plurality of risk levels, and a plurality of recovery actions respectively corresponding to the plurality of risk levels. Each of the plurality of risk levels may have different risk level values depending on a degree to which the second value of the second endurance type deviates from a value obtained according to the threshold function. For example, each of the plurality of risk levels may indicate one of a first risk level and a second risk level.

The endurance manager 111 may compare the difference value and the threshold value (e.g., a target threshold value) and may determine a target risk level among the plurality of risk levels. The difference value may indicate a difference of the second value of the second endurance type and the third value obtained by applying the first value to the threshold function. The threshold value may be determined based on a combination of the first endurance type and the second endurance type.

In some embodiments, the endurance manager 111 may store a threshold value table. The threshold value table may include at least one combination of two different endurance types belonging to each endurance type group and a plurality of threshold values each corresponding to the at least one combination. The endurance manager 111 may obtain the target threshold value by referring to the threshold value table based on the combination of the first endurance type and the second endurance type.

The plurality of recovery actions may include the strong recovery action and the weak recovery action.

In some embodiments, the recovery action table 113 may include the plurality of policy tables. Each of the plurality of policy tables may include a plurality of risk levels and a plurality of recovery actions, which are associated with two endurance types among the plurality of endurance types. For example, a first policy table among the plurality of policy tables may include a plurality of risk levels and a plurality of recovery actions, which are associated with the first endurance type (e.g., a time) and the second endurance type (e.g., the erase count), respectively. A second policy table among the plurality of policy tables may include a plurality of risk levels and a plurality of recovery actions, which are associated with the second endurance type (e.g., the erase count) and the third endurance type (e.g., the reclaim count), respectively. This will be described in detail with reference to FIGS. 8A to 8F.

For convenience of description, the description is given using an example in which each of the plurality of recovery actions is one of the strong recovery action and the weak recovery action, but the present disclosure is not limited thereto. For example, it may be possible to classify each of the plurality of recovery actions as one of three or more recovery action kinds by comparing the above difference value with a plurality of threshold values.

The endurance manager 111 may determine a target recovery action among the plurality of recovery actions by referring to the recovery action table 113 based on the target risk level.

The endurance manager 111 may perform the determined target recovery action as the recovery operation. For example, the endurance manager 111 may control the non-volatile memory device 120 such that the restricted operation is performed; alternatively, the endurance manager 111 may stop all operations of the non-volatile memory device 120 and may provide a report to the host 11. Accordingly, the host (or user) may preserve (e.g., back up) the data stored in the non-volatile memory device 120 before the non-volatile memory device 120 is broken down.

The storage device 100 according to an embodiment of the present disclosure may perform the recovery operation whenever an endurance-related event occurs in the non-volatile memory device 120 or the tendency of occurrence of the endurance-related event is out of a normal tendency, that is, when a probability that the endurance is to be damaged is high. Accordingly, the endurance damage may be preemptively prevented without a separate request from the host.

Also, because the recovery operation is differently performed depending on the degree to which the tendency of occurrence of the endurance-related event is out of the normal tendency, the storage device 100 may have improved endurance coinciding with demands of various storage devices.

Figure 2:
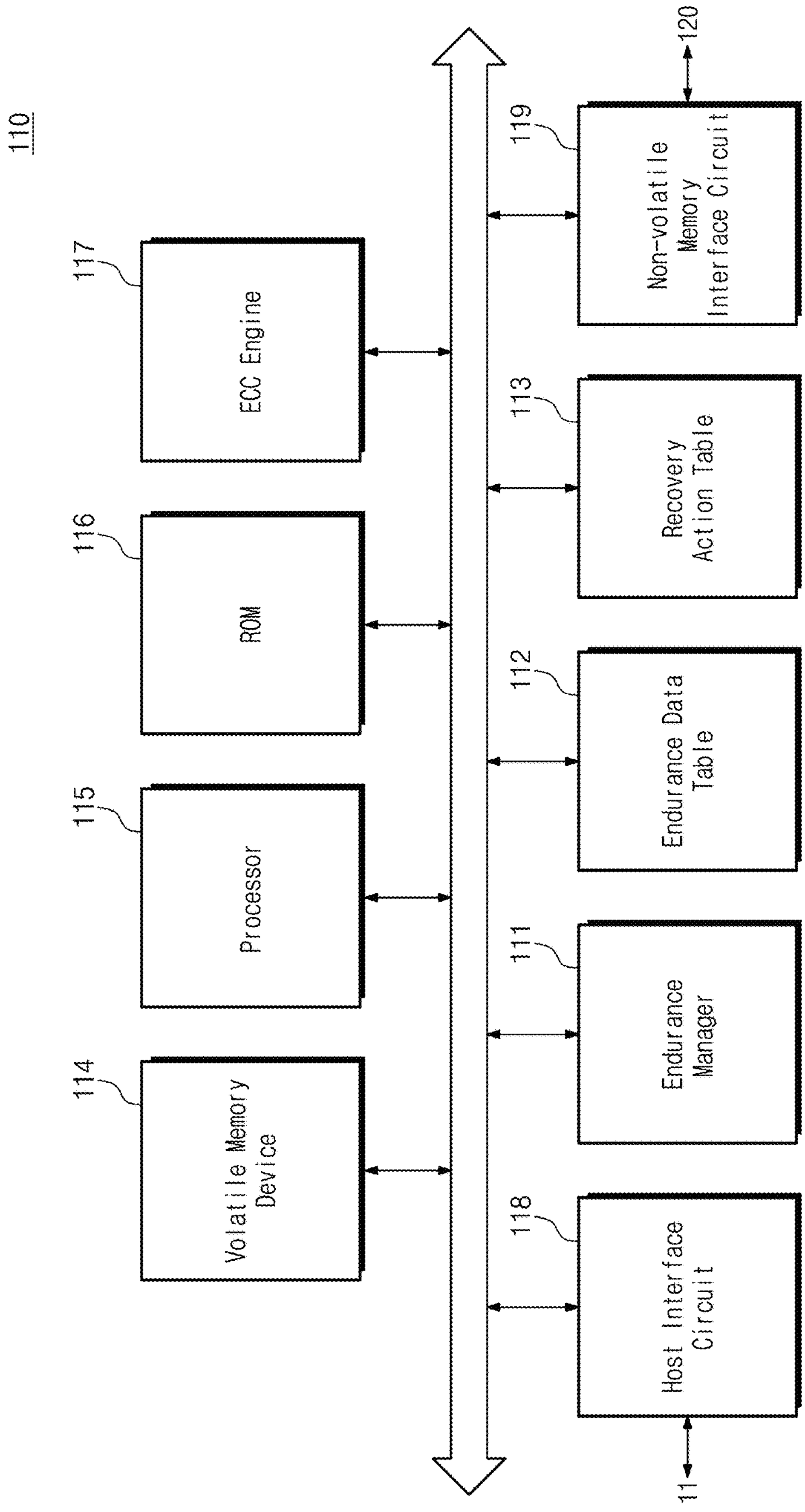
FIG. 2 is a block diagram illustrating a storage controller of FIG. 1 in detail.

FIG. 2 is a block diagram illustrating a storage controller of FIG. 1 in detail. Referring to FIGS. 1 and 2, the storage controller 110 may communicate with the host 11 and the non-volatile memory device 120. The storage controller 110 may include the endurance manager 111, the endurance data table 112, the recovery action table 113, a volatile memory device 114, a processor 115, a read only memory (ROM) 116, an error correcting code (ECC) engine 117, a host interface circuit 118, and a non-volatile memory interface circuit 119.

The endurance manager 111 may generate the endurance data based on a response received from the non-volatile memory device 120 and may perform the recovery operation based on the endurance data. The endurance data table 112 may include the plurality of endurance types and a plurality of values respectively corresponding to the plurality of endurance types. The recovery action table 113 may include the plurality of endurance types, the plurality of risk levels, and the plurality of recovery actions in association with one another.

In some embodiments, the endurance manager 111, the endurance data table 112, and the recovery action table 113 may be implemented with a firmware module. For example, the processor 115 may implement the endurance manager 111, the endurance data table 112, and the recovery action table 113 by loading instructions stored in the non-volatile memory device 120 to the volatile memory device 114 and executing the loaded instructions. However, the present disclosure is not limited thereto. For example, the endurance manager 111, the endurance data table 112, and the recovery action table 113 may be implemented with separate hardware or may be implemented with a combination of hardware and software.

The volatile memory device 114 may be used as a main memory, a buffer memory, or a cache memory of the storage controller 110. The processor 115 may control an overall operation of the storage controller 110. The ROM 116 may be used as a read only memory which stores information necessary for the operation of the storage controller 110.

The ECC engine 117 may detect and correct an error of data obtained from the non-volatile memory device 120. For example, the ECC engine 117 may have an error correction capability of a given level. The ECC engine 117 may manage data having an error level (e.g., a number of flipped bits) exceeding the error correction capability as uncorrectable error data.

The storage controller 110 may communicate with the host 11 through the host interface circuit 118. In some embodiments, the host interface circuit 118 may be implemented based on at least one of various interfaces such as a serial ATA (SATA) interface, a peripheral component interconnect express (PCIe) interface, a serial attached SCSI (SAS), a non-volatile memory express (NVMe) interface, and a universal flash storage (UFS) interface.

The storage controller 110 may communicate with the non-volatile memory device 120 through the non-volatile memory interface circuit 119. In some embodiments, the non-volatile memory interface circuit 119 may be implemented based on a NAND interface.

Figure 3:
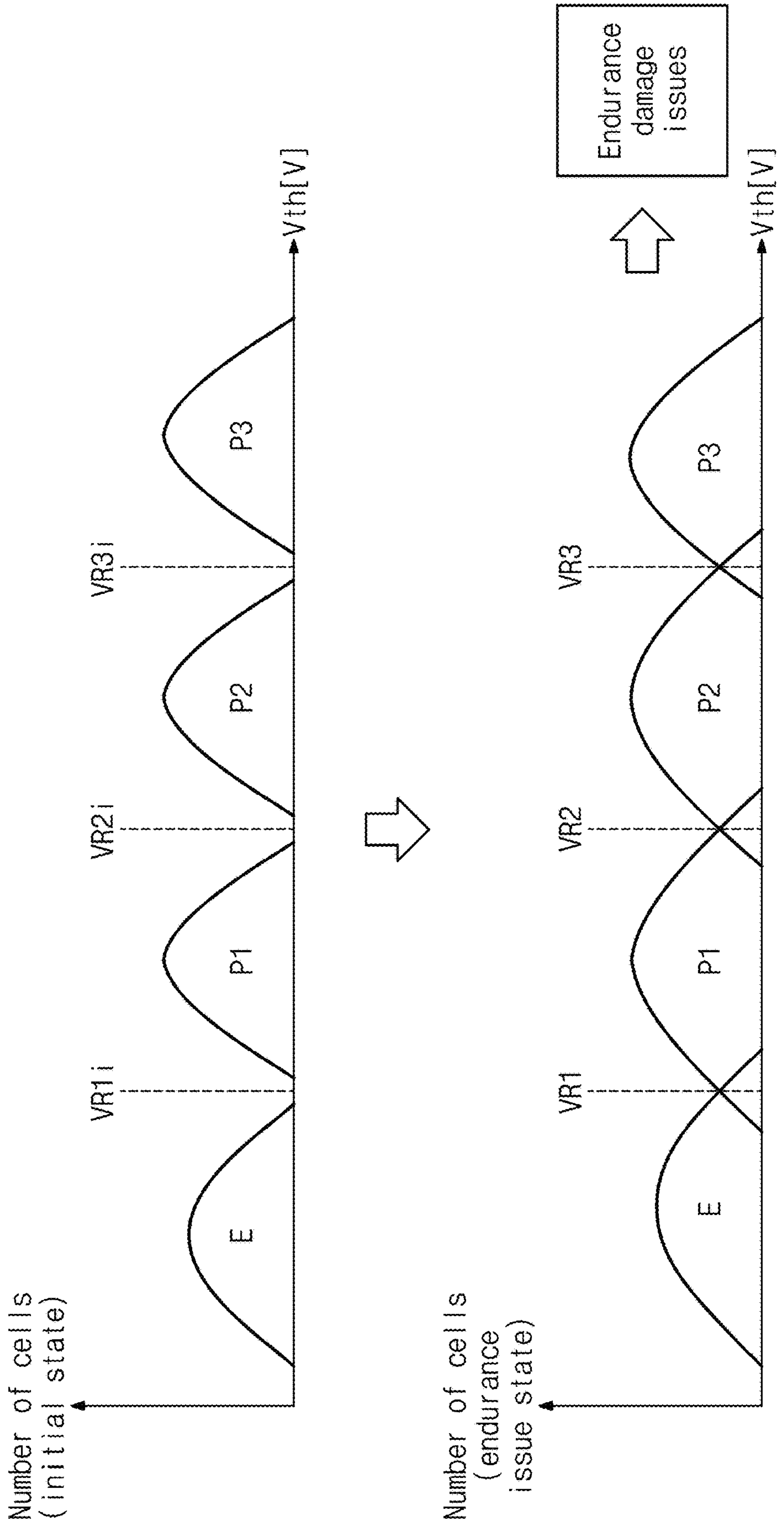
FIG. 3 is a diagram illustrating threshold voltage distributions of related art multi-level cells.

FIG. 3 is a diagram illustrating threshold voltage distributions of related art multi-level cells. A graph showing threshold voltage distributions of multi-level cells MLC each storing two bits is illustrated in FIG. 3. Below, for convenience of description, the multi-level cell MLC is intended to refer to a memory cell storing two bits, a memory cell storing three bits is referred to as a “triple level cell TLC”, and a memory cell storing four bits is referred to as a “quadruple level cell QLC”.

Referring to the graph of the multi-level cells MLC, the horizontal axis represents a threshold voltage (e.g., a level of a threshold voltage), and the vertical axis represents a number of memory cells. The multi-level cell MLC may have one of an erase state “E” and first to third programming states P1, P2, and P3 whose threshold voltage distributions sequentially increase.

In the multi-level cell MLC, a first read voltage level VR1*i* may refer to a voltage for distinguishing the erase state “E” from the first programming state P1. A second read voltage level VR2*i* may refer to a voltage for distinguishing the first programming state P1 from the second programming state P2. A third read voltage level VR3*i* may refer to a voltage for distinguishing the second programming state P2 from the third programming state P3. Like the graph of FIG. 3, in the multi-level cells MLC, it would be understood that the erase state “E” and the first to third programming states P1, P2, and P3 are distinguished by the first to third read voltage levels VR1*i*, VR2*i*, and VR3*i* without overlapping each other.

However, the threshold voltage distributions of the multi-level cells MLC may change due to various causes; in this case, the first to third programming states P1, P2, and P3 may partially overlap each other. For example, as the write operation and the erase operation on the multi-level cells MLC are repeated over time, the threshold voltage distributions may change. When the threshold voltage distributions change, in some cases, there may be a need to determine new first to third read voltage levels VR1, VR2, and VR3 capable of distinguishing the erase state “E” and the first to third programming states P1, P2, and P3.

To solve the issue that an error continuously occurs as the non-volatile memory device 120 performs the memory operation in a state where the threshold voltage distributions of the multi-level cells MLC changes, other memory operations (e.g., a reclaim operation) may be performed, causing the damage of endurance of the non-volatile memory device 120. A related art storage system may execute an endurance defense code to prevent the damage of endurance.

Figure 4:
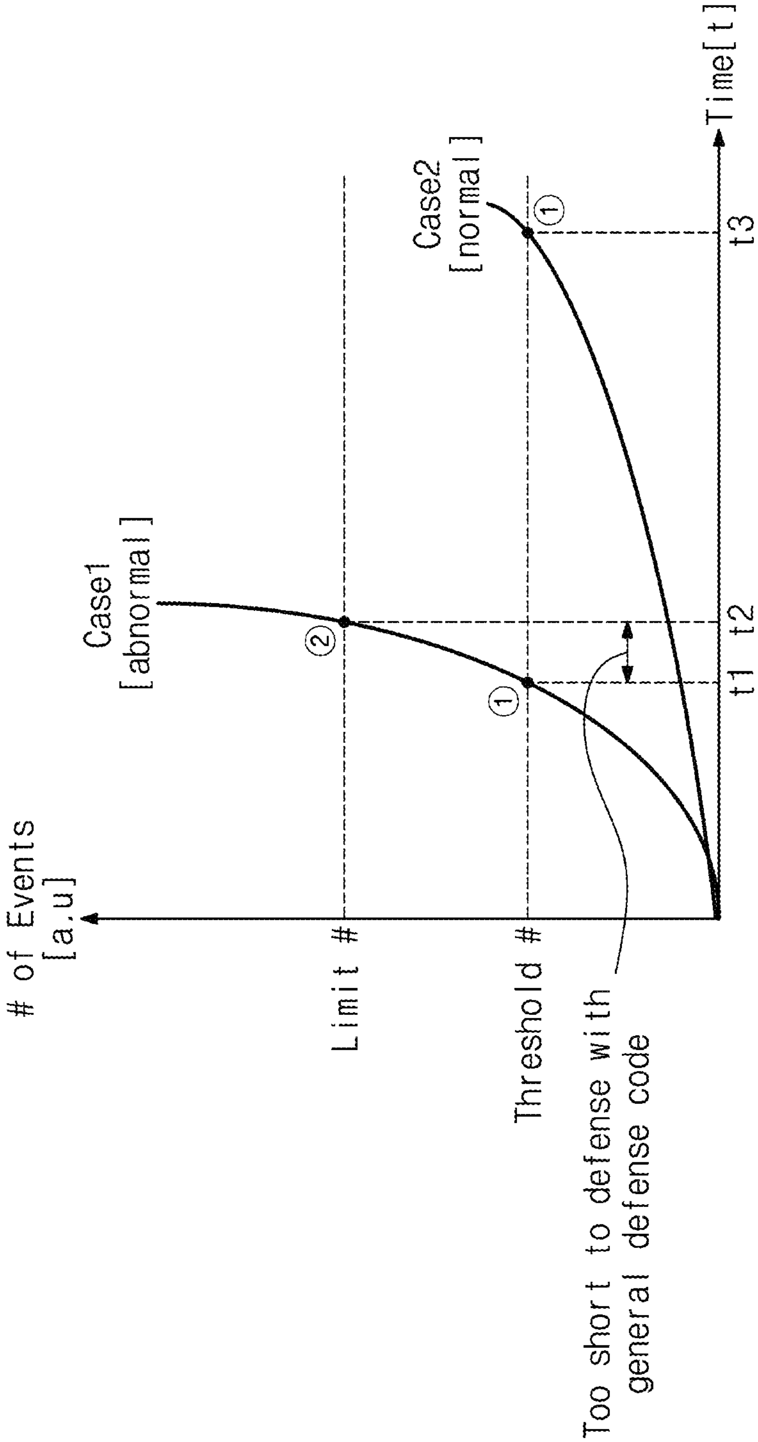
FIG. 4 is a diagram describing an endurance defense code of a related art storage system.

FIG. 4 is a diagram describing an endurance defense code of a related art storage system. Referring to FIG. 4, points in time when a related art storage system executes the endurance defense code in a normal state and an abnormal state are illustrated. In FIG. 4, the horizontal axis represents a time, and the vertical axis represents the number of times of occurrence of an endurance-related event. The endurance-related event which is the endurance type described with reference to FIG. 1 may indicate one of the erase count, the read count, the reclaim count, the number of bad blocks, and the number of times of error correction. The number of endurance-related events may increase as a time passes.

A limit value of the vertical axis indicates a number of times of occurrence of an endurance-related event, which the storage system is capable of enduring. In other words, the number of times of occurrence of an event exceeds the limit value, the storage system may not operate any more.

A threshold value of the vertical axis indicates the number of times of occurrence of an event, at which the endurance defense code of the related art storage system is executed. In other words, when the number of times of occurrence of an endurance-related event reaches a threshold value, the related art storage system executes the endurance defense code. The endurance defense code may indicate an algorithm which a storage controller executes to prevent the damage of endurance of a non-volatile memory device.

For example, when the number of times of occurrence of an endurance-related event increases and then reaches the threshold value at a third point in time t3, the related art storage system may execute the endurance defense code at the third point in time t3 such that the number of times of occurrence of an endurance-related event does not reach the limit value.

However, it is difficult for the related art storage system to defend against the damage of endurance in an abnormal situation where the number of times of occurrence of an endurance-related event sharply increases over time. For example, when the number of times of occurrence of an endurance-related event sharply increases over time and then reaches the threshold value at the first point in time t1, the related art storage system may execute the endurance defense code at the first point in time t1. However, when the number of times of occurrence of an endurance-related event reaches the limit value at a second point in time t2 due to the sharp increase before the effect of the endurance defense code appears, the storage system may be broken out.

Figure 5:
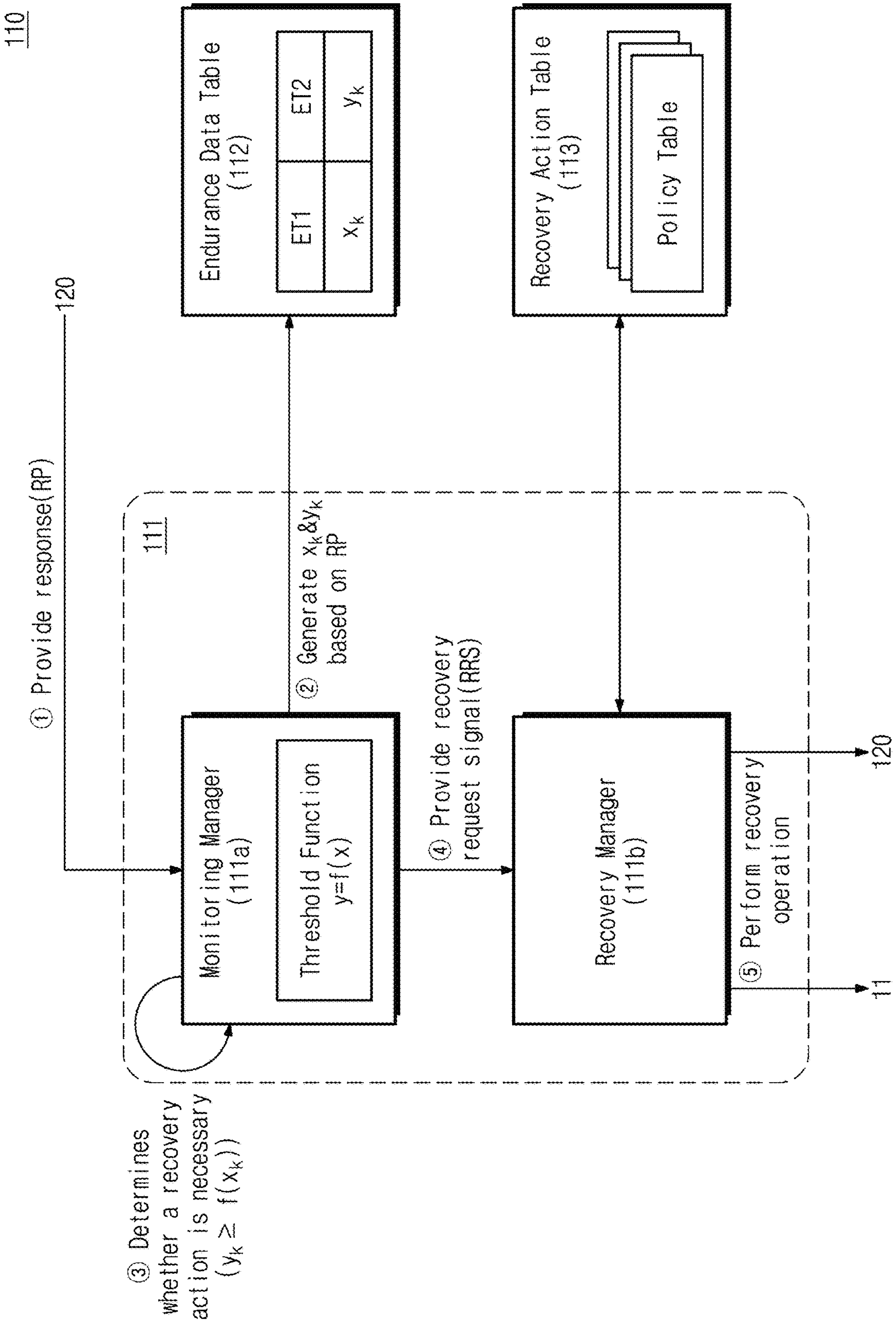
FIG. 5 is a diagram describing an operating method of a storage controller according to one or more example embodiments of the present disclosure.

FIG. 5 is a diagram describing an operating method of a storage controller according to one or more example embodiments of the present disclosure. Referring to FIGS. 1 and 5, the storage controller 110 may communicate with the host 11 and the non-volatile memory device 120. The storage controller 110 may include the endurance manager 111, the endurance data table 112, and the recovery action table 113.

The endurance manager 111 may include a monitoring manager 111*a* and a recovery manager 111*b*.

The monitoring manager 111*a* may monitor the non-volatile memory device 120 to generate the endurance data. The endurance data may include a first endurance type ET1, a first value $x_k$ of the first endurance type ET1, a second endurance type ET2, and a second value $y_k$ of the second endurance type ET2.

The monitoring manager 111*a* may receive a response RP from the non-volatile memory device 120. The monitoring manager 111*a* may obtain existing endurance data by referring to the endurance data table 112, based on receiving the response RP. The monitoring manager 111*a* may generate the endurance data by updating the existing endurance data based on the response RP. The monitoring manager 111*a* may update the endurance data table 112 based on the updated endurance data.

The monitoring manager 111*a* may store a threshold function "y=f(x)". The threshold function fx may be defined based on a correlation between the first endurance type ET1 and the second endurance type ET2. For example, the threshold function fx may define a value of the second endurance type ET2, which is expected depending on a value of the first endurance type ET1. The monitoring manager 111*a* may obtain a first expected value $f(x_k)$ by applying the first value $x_k$ of the first endurance type ET1 to the threshold function fx. The monitoring manager 111*a* may perform the first comparison operation of comparing the first expected value $f(x_k)$ and the second value $y_k$ of the second endurance type ET2.

The monitoring manager 111*a* may generate a recovery request signal RRS, based on determining that the second value $y_k$ is greater than or equal to the first expected value $f(x_k)$. The recovery request signal RRS may be a signal indicating an initiation of the recovery operation of the recovery manager 111*b*. The recovery request signal RRS may include the first endurance type ET1, the second endurance type ET2, and a difference value of the second value $y_k$ and the first expected value $f(x_k)$.

The monitoring manager 111*a* may provide the recovery request signal RRS to the recovery manager 111*b*.

The recovery manager 111*b* may receive the recovery request signal RRS from the monitoring manager 111*a*. The recovery manager 111*b* may determine a recovery threshold value, based on the first endurance type ET1 and the second endurance type ET2 of the recovery request signal RRS. The recovery threshold value may be defined based on the first endurance type ET1 and the second endurance type ET2 and may be determined in advance.

In some embodiments, the recovery manager 111*b* may include a recovery threshold value table. The recovery threshold value table may include at least one combination of two different endurance types belonging to each endurance type group and a plurality of recovery threshold values each corresponding to the combination. The recovery manager 111*b* may determine a recovery threshold value corresponding to the first endurance type ET1 and the second endurance type ET2 by referring to the recovery threshold value table.

The recovery manager 111*b* may determine a risk level based on the second comparison operation of comparing the difference value and the determined recovery threshold value.

In some embodiments, the risk level may be one of a first level and a second level. For example, the recovery manager 111*b* may generate the risk level as the first level, based on determining that the difference value is smaller than or equal to the recovery threshold value. In contrast, the recovery manager 111*b* may generate the risk level as the second level, based on determining that the difference value is greater than the recovery threshold value.

The recovery manager 111*b* may determine a recovery action by referring to the recovery action table 113 based on the first endurance type ET1, the second endurance type ET2, and the risk level.

The recovery action table 113 may include at least one combination of two different endurance types belonging to each endurance type group, a plurality of risk levels, and a plurality of recovery actions corresponding to one of the combinations of the endurance type groups and one of the risk levels.

In some embodiments, the recovery action table 113 may include the plurality of policy tables. Each of the plurality of policy tables may correspond to one of the combinations of the endurance type groups each including two different endurance types. This will be described in detail with reference to FIGS. 8A to 8F.

The recovery manager 111*b* may perform the determined recovery action. For example, the recovery manager 111*b* may control the non-volatile memory device 120 such that only a restricted operation is performed; alternatively, the recovery manager 111*b* may stop an operation of the non-volatile memory device 120 and may provide a report to the host 11.

Below, an operating method of the storage controller 110 according to one or more example embodiments of the present disclosure will be described in detail.

In a first operation ①, the monitoring manager 111*a* may receive the response RP from the non-volatile memory device 120. The response RP may correspond to the memory operation of the non-volatile memory device 120.

In a second operation ②, the monitoring manager 111*a* may generate the endurance data based on the response RP. The monitoring manager 111*a* may obtain existing endurance data by referring to the endurance data table 112. The monitoring manager 111*a* may generate the first value $x_k$ of the first endurance type ET1 and the second value $y_k$ of the second endurance type ET2 by updating the existing endurance data based on the response RP. The monitoring manager 111*a* may update the endurance data table 112 based on the first value $x_k$ of the first endurance type ET1 and the second value $y_k$ of the second endurance type ET2.

In a third operation ③, the monitoring manager 111*a* may determine whether the recovery action is necessary. The monitoring manager 111*a* may determine that the recovery action is necessary, based on determining that the second value $y_k$ is greater than or equal to the first expected value "$y=f(x_k)$" obtained by applying the first value $x_k$ to the threshold function fx.

In a fourth operation ④, the monitoring manager 111*a* may provide the recovery request signal RRS to the recovery manager 111*b*.

In a fifth operation ⑤, the recovery manager 111*b* may perform the recovery operation. In detail, the recovery manager 111*b* may determine the recovery action by referring to the recovery action table 113 based on the recovery request signal RRS. For example, the recovery manager 111*b* may determine the recovery action based on the recovery threshold value, which is determined according to the recovery request signal RRS.

In some embodiments, the recovery manager 111*b* may allow the non-volatile memory device 120 to perform only the read operation, based on determining the weak recovery action as the recovery operation. In some embodiments, based on determining the strong recovery action as the recovery operation, the recovery manager 111*b* may stop an operation of the non-volatile memory device 120 and may notify the host 11 that the operation of the non-volatile memory device 120 is stopped.

Figure 6:
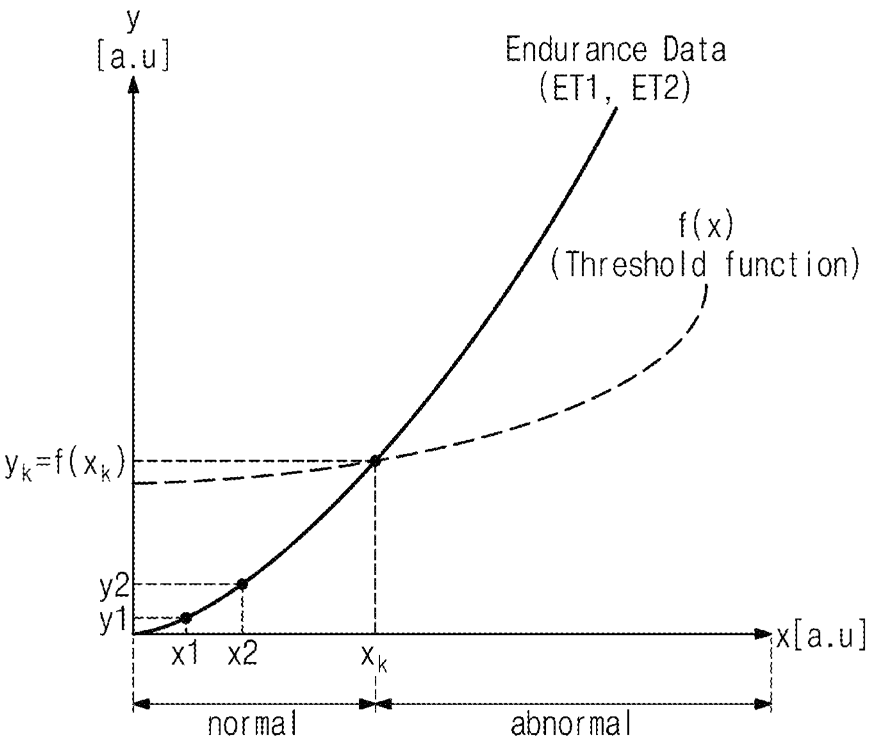
FIG. 6 is a diagram describing a threshold function and endurance data according to one or more example embodiments of the present disclosure.

FIG. 6 is a diagram describing a threshold function and endurance data according to one or more example embodiments of the present disclosure. The threshold function and the first comparison operation using the threshold function and the endurance data will be described with reference to FIGS. 5 and 6. In FIG. 6, the horizontal axis represents the first value "x" of the first endurance type ET1, and the vertical axis represents the second value "y" of the second endurance type ET2.

The threshold function fx may be defined in advance based on a correlation between the first endurance type ET1 and the second endurance type ET2. The threshold function fx may be referred to as a "tendency of the second endurance type ET2 to the first endurance type ET1".

An endurance manager may compare the second value "y" and a value obtained by applying the first value "x" to the threshold function fx and may determine whether the recovery operation is required.

The first value "x" and the second value "y" of the endurance data increases whenever a non-volatile memory device performs an operation corresponding to the endurance type. For example, when the first value "x" is a first X-axis value x1, the second value "y" may be a first Y-axis value y1; when the first value "x" is a second X-axis value x2, the second value "y" may be a second Y-axis value y2; when the first value "x" is a k-th X-axis value $x_k$, the second value "y" may be a k-th Y-axis value $y_k$.

When the first value "x" is the first X-axis value x1 or the second X-axis value x2, the first Y-axis value y1 or the second Y-axis value y2 is smaller than a value obtained by applying the first value "x" to the threshold function fx. The endurance manager may determine the state of the non-volatile memory device as a normal state where a probability that the endurance of the non-volatile memory device is damaged is low and may determine that the recovery operation is not required.

When the first value "x" is the k-th X-axis value $x_k$, the k-th Y-axis value yk is equal to a value $f(x_k)$ obtained by applying the k-th X-axis value xx to the threshold function fx. In this case, the endurance manager may determine the state of the non-volatile memory device as an abnormal state where a probability that the endurance of the non-volatile memory device is damaged is high and may determine that the recovery operation is required.

In some embodiments, the first endurance type ET1 may be a time, and the second endurance type ET2 may indicate the erase count. In this case, the erase count may indicate the erase count before a first refresh operation is performed or may indicate the erase count before a next refresh operation is performed after the first refresh operation is performed. The endurance manager may use the threshold function fx indicating a tendency of the erase count over time.

In some embodiments, the first endurance type ET1 may be a time, and the second endurance type ET2 may indicate the read count. In this case, the read count may indicate the read count before the first refresh operation is performed or may indicate the read count before a next refresh operation is performed after the first refresh operation is performed. The endurance manager may use the threshold function fx indicating a tendency of the read count over time.

In some embodiments, the first endurance type ET1 may indicate one of the erase count and the read count. The second endurance type ET2 may be the reclaim count. The endurance manager may use the threshold function fx indicating a tendency of the reclaim count according to the erase count or the threshold function fx indicating a tendency of the reclaim count according to the read count.

In some embodiments, the first endurance type ET1 may indicate one of the erase count and the read count. The second endurance type ET2 may be the number of bad blocks. The endurance manager may use the threshold function fx indicating a tendency of the number of bad blocks according to the erase count or the threshold function fx indicating a tendency of the number of bad blocks according to the read count.

In some embodiments, the first endurance type ET1 may indicate one of the erase count and the read count. The second endurance type ET2 may indicate the number of times of execution of an error correction code. The endurance manager may use the threshold function fx indicating a tendency of the number of times of execution of an error correction code according to the erase count or the threshold function fx indicating a tendency of the number of times of execution of an error correction code according to the read count.

In some embodiments, the first endurance type ET1 may indicate one of the erase count and the read count. The second endurance type ET2 may indicate an error correction step. The endurance manager may use the threshold function fx indicating a tendency of an error correction step according to the erase count or the threshold function fx indicating a tendency of an error correction step according to the read count.

The storage device according to the present disclosure may prevent the damage of endurance by performing the recovery operation when the endurance data are out of the tendency expected for a normal storage device.

For convenience of description, the threshold function fx and the endurance data are illustrated as the second value "y" of the second endurance type ET2 increases as the first value "x" of the first endurance type ET1 increases, but the present disclosure is not limited thereto. Even if the first value "x" increases, the second value "y" may be maintained without increasing.

FIG. 7 is a table describing a threshold function and endurance data according to one or more example embodiments of the present disclosure. The first comparison operation of comparing the endurance data and the threshold function fx, performed the endurance manager 111, will be described with reference to FIGS. 5 and 7.

The endurance data may include a first value of the first endurance type ET1 and a second value of the second endurance type ET2. The threshold function fx may be defined based on a correlation between the first endurance type ET1 and the second endurance type ET2.

In some embodiments, the endurance manager may generate a determination result based on a comparison result of the first comparison operation. The determination result may indicate one of a normal state or an abnormal state. The endurance manager may perform the recovery operation based on determining that the determination result indicates the abnormal state and may not perform the recovery operation based on determining that the determination result indicates the normal state.

The first value and the second value may be a first X-axis value x1 and a first Y-axis value y1, respectively. The endurance manager may compare the first Y-axis value y1 with a value f(x1) obtained by applying the first X-axis value x1 to the threshold function fx. When the first Y-axis value y1 is smaller than the obtained value f(x1), the endurance manager may determine that the non-volatile memory device is in the normal state.

The first value and the second value may be a second X-axis value x2 and a second Y-axis value y2, respectively. The endurance manager may compare the second Y-axis value y2 with a value f(x2) obtained by applying the second X-axis value x2 to the threshold function fx. When the second Y-axis value y2 is smaller than the obtained value f(x2), the endurance manager may determine that the non-volatile memory device is in the normal state.

The first value and k value may be a k-th X-axis value $x_k$ and a k-th Y-axis value $y_k$, respectively. The endurance manager may compare the k-th Y-axis value $y_x$ with a value $f(x_k)$ obtained by applying the k-th X-axis value $x_k$ to the threshold function fx. When the k-th Y-axis value $y_k$ is greater than or equal than the obtained value $f(x_k)$, the endurance manager may determine that the non-volatile memory device is in the abnormal state. The endurance manager may perform the recovery operation.

FIGS. 8A to 8F are tables illustrating a policy table of FIG. 5. For convenience of description, FIGS. 8A to 8F may be referred to as "FIG. 8". Referring to FIGS. 5 and 8, each of the plurality of policy tables of FIG. 5 is illustrated as an example. The policy table may include the first endurance type ET1, the second endurance type ET2, the plurality of risk levels, and the plurality of recovery actions respectively corresponding to the plurality of risk levels.

FIG. 8A shows the policy table corresponding to a case where the first endurance type ET1 is a time and the second endurance type ET2 is an erase count EC.

When the risk level is the first level, that is, when the endurance manager determines that the difference value does not exceed a first threshold value Th1, the endurance manager may control the non-volatile memory device such that only a restricted operation is performed. For example, the endurance manager may allow the non-volatile memory device to perform only the read operation.

When the risk level is the second level, that is, when the endurance manager determines that the difference value exceeds the first threshold value Th1, the endurance manager may stop an operation of the non-volatile memory device and may notify the host that the operation is stopped.

FIG. 8B shows the policy table corresponding to a case where the first endurance type ET1 is a time and the second endurance type ET2 is a read count RC.

When the risk level is the first level, that is, when the endurance manager determines that the difference value does not exceed a second threshold value Th2, the endurance manager may reset read levels of the memory cells of the non-volatile memory device. For example, the endurance manager may load reset information stored in the non-volatile memory device and may reset the read levels of the memory cells. The reset information may include an initial value of each of the read levels of the memory cells. The reset information may be defined in advance and may be stored in the non-volatile memory device.

When the risk level is the second level, that is, when the endurance manager determines that the difference value exceeds the second threshold value Th2, the endurance manager may stop an operation of the non-volatile memory device and may notify the host that the operation is stopped.

FIG. 8C shows the policy table corresponding to a case where the first endurance type ET1 is the erase count EC or the read count RC and the second endurance type ET2 is the number of times of reclaim.

When the risk level is the first level, that is, when the endurance manager determines that the difference value does not exceed a third threshold value Th3, the endurance manager may control the non-volatile memory device such that only a restricted operation is performed. For example, the endurance manager may allow the non-volatile memory device to perform only the read operation.

When the risk level is the second level, that is, when the endurance manager determines that the difference value exceeds the third threshold value Th3, the endurance manager may stop an operation of the non-volatile memory device and may notify the host that the operation is stopped.

FIG. 8D shows the policy table corresponding to a case where the first endurance type ET1 is the erase count EC or the read count RC and the second endurance type ET2 is the program fail count or the erase fail count.

When the risk level is the first level, that is, when the endurance manager determines that the difference value does not exceed a fourth threshold value Th4, the endurance manager may control the non-volatile memory device such that only a restricted operation is performed. For example, the endurance manager may allow the non-volatile memory device to perform only the read operation.

When the risk level is the second level, that is, when the endurance manager determines that the difference value exceeds the fourth threshold value Th4, the endurance manager may stop an operation of the non-volatile memory device and may notify the host that the operation is stopped.

FIG. 8E shows the policy table corresponding to a case where the first endurance type ET1 is the erase count EC or the read count RC and the second endurance type ET2 is the number of times of execution of an error correction code or the error correction step.

When the risk level is the first level, that is, when the endurance manager determines that the difference value does not exceed a fifth threshold value Th5, the endurance manager may control the non-volatile memory device such that only a restricted operation is performed. For example, the endurance manager may allow the non-volatile memory device to perform only the read operation.

When the risk level is the second level, that is, when the endurance manager determines that the difference value exceeds the fifth threshold value Th5, the endurance manager may stop an operation of the non-volatile memory device and may notify the host that the operation is stopped.

FIG. 8F shows the policy table corresponding to a case where the first endurance type ET1 is the erase count EC or the read count RC and the second endurance type ET2 is the number of bad blocks.

When the risk level is the first level, that is, when the endurance manager determines that the difference value does not exceed a sixth threshold value Th6, the endurance manager may control the non-volatile memory device such that only a restricted operation is performed. For example, the endurance manager may allow the non-volatile memory device to perform only the read operation.

When the risk level is the second level, that is, when the endurance manager determines that the difference value exceeds the sixth threshold value Th6, the endurance manager may stop an operation of the non-volatile memory device and may notify the host that the operation is stopped.

For convenience of description, the description is given using an example in which the endurance manager compares the difference value with one threshold value and performs one of two recovery operations depending on a comparison result, but the present disclosure is not limited thereto. The endurance manager may compare the difference value with two or more threshold values and may perform one of three or more recovery operations. Also, a kind of each of the recovery operations is not limited thereto. For example, the endurance manager may control the non-volatile memory device such that only a restricted operation is performed and may notify the host that the non-volatile memory device is controlled to perform only the restricted operation. As another example, the endurance manager may report a situation to the host for the purpose of debugging in a development process of a product which includes the storage device according to the present disclosure.

Also, the recovery action table is described as including the policy tables of FIGS. 8A to 8F, but the present disclosure is not limited thereto. The recovery action table may correspond to a table implemented by merging the policy tables of FIGS. 8A to 8F for each column. In this case, the recovery manager may determine the recovery operation by referring to the recovery action table based on the first endurance type, the second endurance type, and the risk level.

Figure 9:
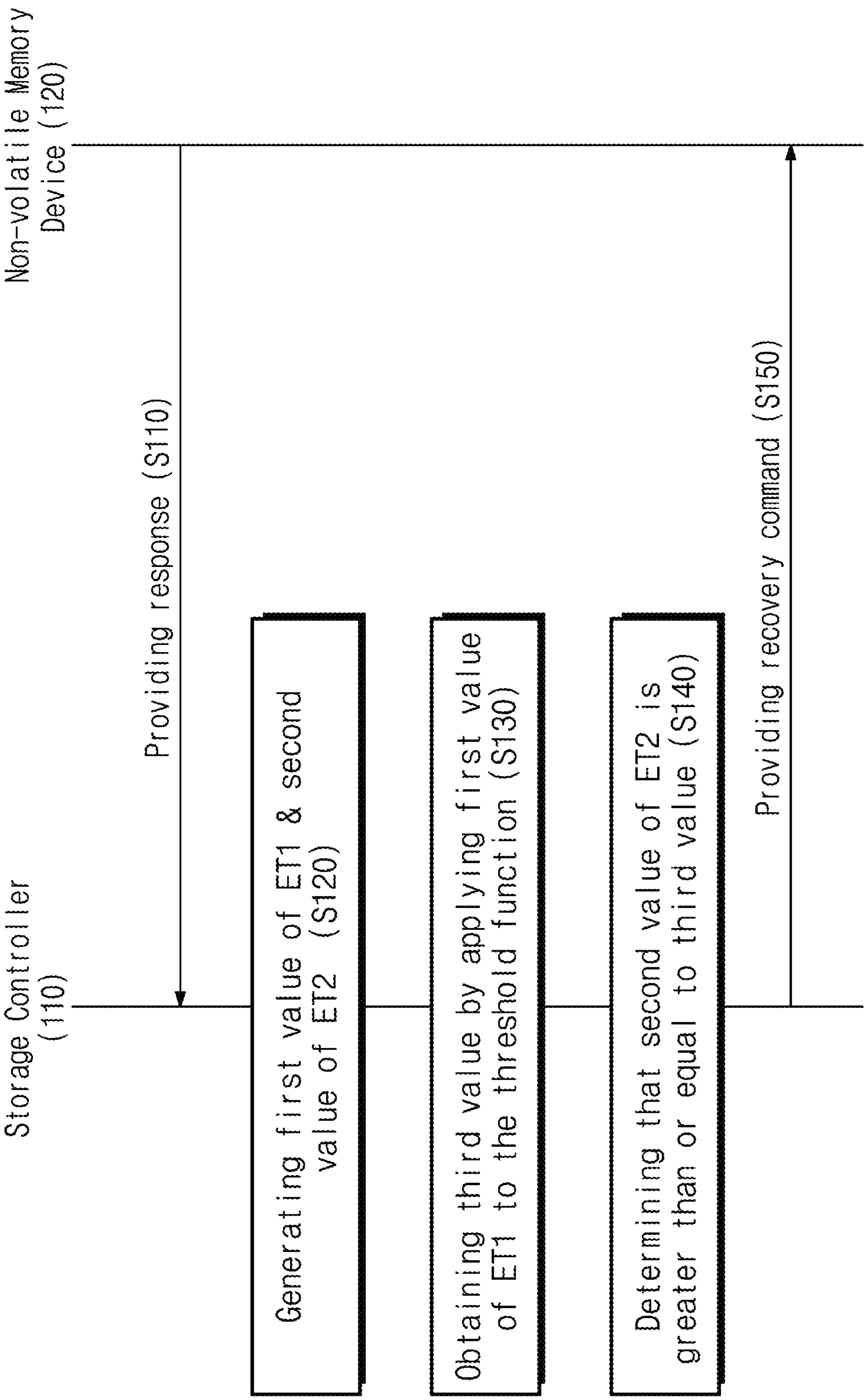
FIG. 9 is a flowchart describing an operating method of a storage device according to an embodiment of the present disclosure.

FIG. 9 is a flowchart describing an operating method of a storage device according to an embodiment of the present disclosure. Referring to FIGS. 1 and 9, a storage device may include the storage controller 110 and the non-volatile memory device 120.

In operation S110, the non-volatile memory device 120 may provide a response to the storage controller 110. The response may correspond to at least one memory operation performed by the non-volatile memory device 120.

In operation S120, the storage controller 110 may generate the first value of the first endurance type ET1 and the second value of the second endurance type ET2 based on the response.

In some embodiments, operation S120 may include obtaining a first existing value of a first endurance type and a second existing value of a second endurance type by referring to an endurance data table, generating a first value by adding a value (e.g., the number of times) of the first endurance type included in a response to the first existing value, and generating a second value by adding a value (e.g., the number of times) of the second endurance type included in the response to the second existing value. The number of times of the first endurance type and the number of times of the second endurance type included in the response may be an integer which is not negative.

In some embodiments, the storage controller 110 may update the endurance data table based on the first value and the second value. The first existing value of the endurance data table may be changed to the first value, and the second existing value thereof may be changed to the second value.

In operation S130, the storage controller 110 may obtain a third value by applying the first value of the first endurance type ET1 to the threshold function.

In some embodiments, the threshold function may be defined based on a correlation between the first endurance type ET1 and the second endurance type ET2. The threshold function may be defined in advance.

In operation S140, the storage controller 110 may determine that the second value of the second endurance type ET2 is greater than or equal to the third value.

In operation S150, the storage controller 110 may provide a recovery command to the non-volatile memory device 120. The recovery command may indicate all commands provided to the non-volatile memory device 120 while the storage controller 110 performs the recovery operation.

In some embodiments, operation S150 may include determining the recovery operation corresponding to the first endurance type, the second endurance type, and a difference value between the second value and the third value, based on determining that the second value is greater than or equal to the third value, and providing the recovery command corresponding to the determined recovery operation to the non-volatile memory device 120.

In some embodiments, operation S150 may include determining whether the difference value between the second value and the third value exceeds the threshold value determined based on a combination of the first endurance type and the second endurance type, performing the strong recovery action as the recovery operation when the difference value exceeds the threshold value, and performing the weak recovery action as the recovery operation when the difference value does not exceed the threshold value.

In some embodiments, operation S150 may include calculating the difference value between the second value and the third value, determining a target risk level among a plurality of risk levels depending on whether the difference value exceeds the threshold value, determining a target recovery action among a plurality of recovery actions by referring to a recovery action table based on the target risk level, and providing a command corresponding to the target recovery action to the non-volatile memory device 120.

For example, the recovery command may include one or more read commands. As another example, the recovery command may be a command for stopping an operation of the non-volatile memory device 120.

Figure 10:
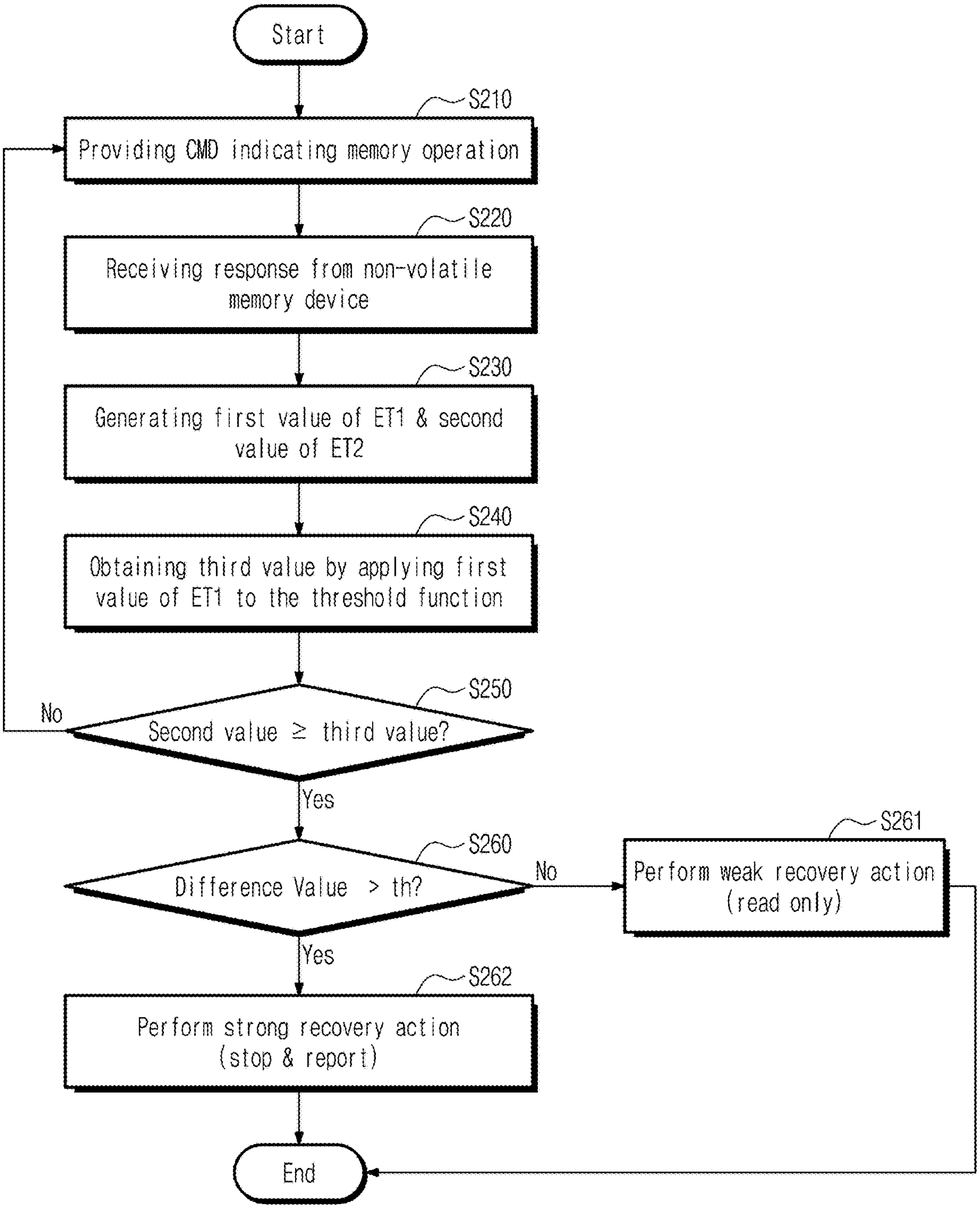
FIG. 10 is a flowchart describing an operating method of a storage controller according to one or more example embodiments of present disclosure.

FIG. 10 is a flowchart describing an operating method of a storage controller according to one or more example embodiments of present disclosure. An operating method of the storage controller 110 of FIG. 1 will be described with reference to FIG. 10.

In operation S210, a storage controller may provide a command indicating a memory operation to a non-volatile memory device. For example, the storage controller may provide the non-volatile memory device with one of a read command indicating a read operation and a write command indicating a write operation.

In operation S220, the storage controller may receive a response corresponding to the memory operation from the non-volatile memory device.

In operation S230, the storage controller may generate a first value of the first endurance type ET1 and a second value of the second endurance type ET2 based on the response.

In operation S240, the storage controller may obtain a third value by applying the first value of the first endurance type ET1 to the threshold function.

In operation S250, the storage controller may determine whether the second value of the second endurance type ET2 is greater than or equal to the third value. When it is determined that the second value is smaller than the third value, the storage controller may perform operation S210. In other words, the storage controller may determine that the non-volatile memory device is in a normal state and may control the non-volatile memory device such that the memory operation is continuously performed. When it is determined that the second value is greater than or equal to the third value, the storage controller may perform operation S260.

In operation S260, the storage controller may determine whether a difference value between the second value and the third value exceeds a threshold value.

In some embodiments, the storage controller may determine the threshold value based on the first endurance type ET1 and the second endurance type ET2. For example, the storage controller may store at least one combination of two different endurance types belonging to each of endurance type groups and threshold values each corresponding to one of the at least one combination.

The storage controller may perform operation S262 based on determining that the difference value exceeds the threshold value. The storage controller may perform operation S261 based on determining that the difference value not exceed the threshold value.

In operation S261, the storage controller may perform the weak recovery action as the recovery operation. For example, the storage controller may allow the non-volatile memory device to perform only the read operation.

In operation S262, the storage controller may perform the strong recovery action as the recovery operation. For example, the storage controller may stop an operation of the non-volatile memory device and may notify the host that the operation is stopped.

Figure 11:
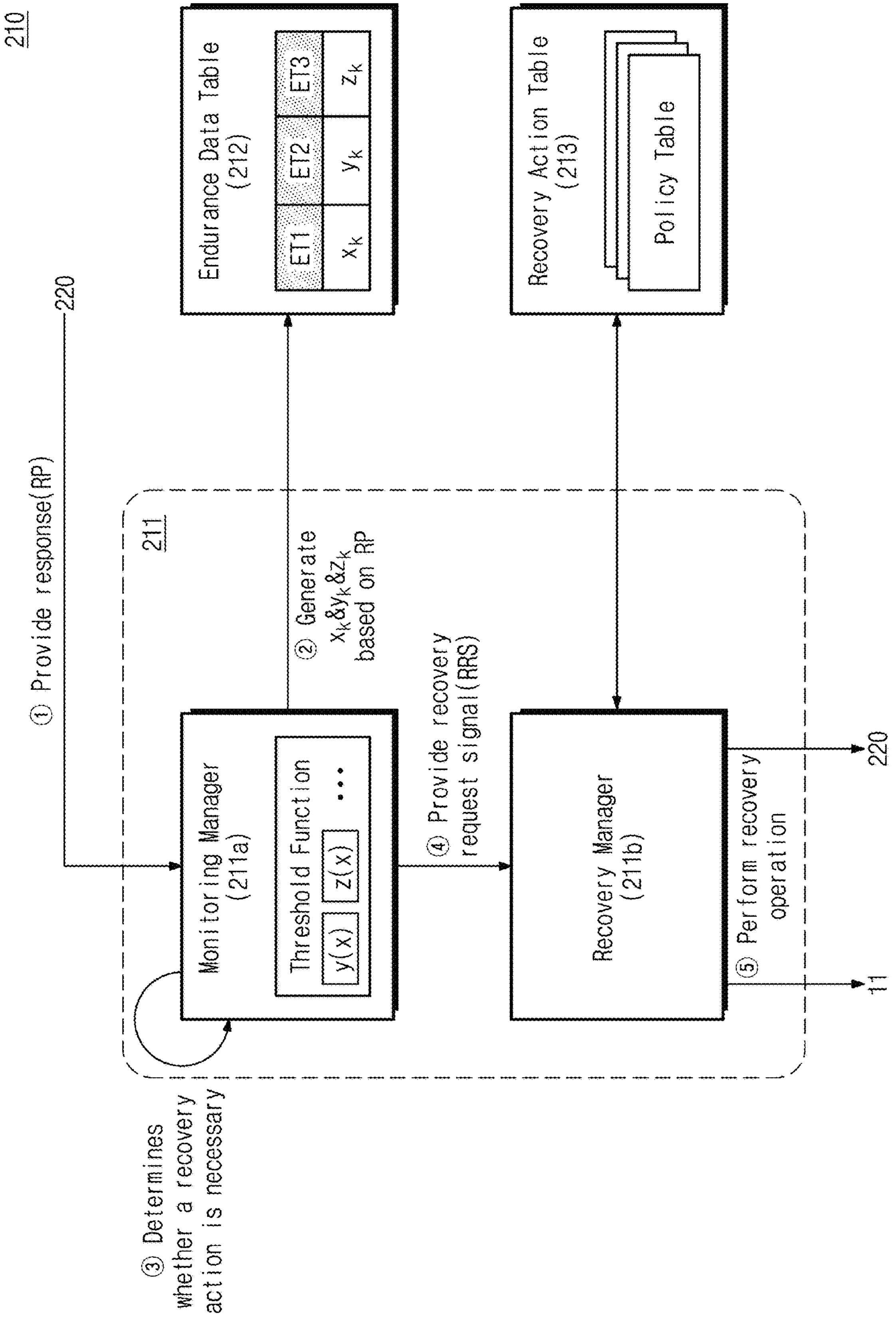
FIG. 11 is a diagram describing an operating method of a storage controller to monitor three or more endurance types in detail, according to one or more example embodiments of the present disclosure.

FIG. 11 is a diagram describing an operating method of a storage controller to monitor three or more endurance types in detail, according to one or more example embodiments of the present disclosure. Referring to FIG. 11, a storage controller may monitor three or more endurance types and may use two or more threshold functions.

The host 11, a storage controller 210, and a non-volatile memory device 220 of FIG. 11 may respectively correspond to the host 11, the storage controller 110, and the non-volatile memory device 120 of FIG. 1. An endurance manager 211, a monitoring manager 211*a*, a recovery manager 211*b*, an endurance data table 212, and a recovery action table 213 of FIG. 11 may respectively correspond to the endurance manager 111, the monitoring manager 111*a*, the recovery manager 111*b*, the endurance data table 112, and the recovery action table 113 of FIG. 5.

The monitoring manager 211*a* may generate endurance data, based on the response RP received from the non-volatile memory device 220. The endurance data may include a plurality of endurance types and values respectively corresponding to the plurality of endurance types.

For example, the endurance data may include the first endurance type ET1, the second endurance type ET2, and a third endurance type ET3 and may include the first value $x_k$ of the first endurance type ET1, the second value $y_k$ of the second endurance type ET2, and a third value $z_k$ of the third endurance type ET3.

The monitoring manager 211*a* may obtain existing endurance data from the endurance data table 212 and may generate the first to third values $x_k$, $y_k$, and $z_k$ by updating the existing endurance data based on the response RP. The monitoring manager 211*a* may update the endurance data table 212 based on the first to third values $x_k$, $y_k$, and $z_k$.

The monitoring manager 211*a* may store a plurality of threshold functions. For example, the monitoring manager 211*a* may store a first threshold function y(x) and a second threshold function z(x). The first threshold function y(x) may be defined based on a correlation between the first endurance type ET1 and the second endurance type ET2. The second threshold function z(x) may be defined based on a correlation between the first endurance type ET1 and the third endurance type ET3. Although not illustrated, the monitoring manager 211*a* may further store a third threshold function which is defined based on a correlation between the second endurance type ET2 and the third endurance type ET3.

The monitoring manager 211*a* may obtain a fourth value $y(x_k)$ by applying the first value $x_k$ to the first threshold function y(x). The monitoring manager 211*a* may determine whether the second value $y_k$ is greater than or equal to the fourth value $y(x_k)$.

Also, the monitoring manager 211*a* may obtain a fifth value $z(x_k)$ by applying the first value $x_k$ to the second threshold function z(x). The monitoring manager 211*a* may determine whether the third value $z_k$ is greater than or equal to the fifth value $z(x_k)$.

The monitoring manager 211*a* may generate the recovery request signal RRS, based on determining that the second value $y_k$ is greater than or equal to the fourth value $y(x_k)$ and/or determining that the third value $z_k$ is greater than or equal to the fifth value $z(x_k)$.

When the second value $y_k$ is greater than or equal to the fourth value $y(x_k)$, the recovery request signal RRS may include the first endurance type ET1, the second endurance type ET2, and a first difference value. The first difference value may indicate a difference between the second value $y_k$ and the fourth value $y(x_k)$.

When the third value $z_k$ is greater than or equal to the fifth value $z(x_k)$, the recovery request signal RRS may include the first endurance type ET1, the third endurance type ET3, and a second difference value. The second difference value may indicate a difference between the third value $z_k$ and the fifth value $z(x_k)$.

When the second value $y_k$ is greater than or equal to the fourth value $y(x_k)$ and when the third value $z_k$ is greater than or equal to the fifth value $z(x_k)$, the recovery request signal RRS may include the first endurance type ET1, the second endurance type ET2, the third endurance type ET3, and the first difference value, and the second difference value.

The recovery manager 211*b* may determine a recovery operation based on the recovery request signal RRS and may perform the determined recovery operation. For convenience of description, a case where endurance data are out of both the tendency of the first threshold function and the tendency of the second threshold function will be described below. When the endurance data are out of only one of the two tendencies, the recovery manager 211*b* operates to be similar to the recovery manager 111*b* of FIG. 5.

The recovery manager 211*b* may determine a first risk level, based on the first endurance type ET1, the second endurance type ET2, and the first difference value of the recovery request signal RRS.

In some embodiments, the recovery manager 211*b* may store at least one combination of two different endurance types belonging to each endurance type group and a plurality of threshold values each corresponding to one of the at least one combination. The recovery manager 211*b* may determine a first threshold value corresponding to a combination of the first endurance type ET1 and the second endurance type ET2. The recovery manager 211*b* may compare the first difference value and the first threshold value and may determine the first risk level based on a result of comparison.

For example, when the first difference value does not exceed the first threshold value, the recovery manager 211*b* may determine the first risk level to be a first level. In contrast, when the first difference value exceeds the first threshold value, the recovery manager 211*b* may determine the first risk level to be a second level.

As in the above description, the recovery manager 211*b* may determine a second risk level, based on the first endurance type ET1, the third endurance type ET3, and the second difference value of the recovery request signal RRS.

The recovery manager 211*b* may determine a first recovery action corresponding to the first risk level by referring to a first policy table corresponding to the first endurance type ET1 and the second endurance type ET2 from among a plurality of policy tables of the recovery action table 213. The plurality of policy tables correspond to the policy table of FIGS. 5 and 8.

Likewise, the recovery manager 211*b* may determine a second recovery action corresponding to the second risk level by referring to a second policy table corresponding to the first endurance type ET1 and the third endurance type ET3 from among the plurality of policy tables.

The recovery manager 211*b* may perform the first recovery action and the second recovery action as the recovery operation. When the first recovery action is the same as the second recovery action, the recovery manager 211*b* may perform the first recovery action once as the recovery operation.

According to one or more example embodiments of the present, an operating method of the storage controller 210 will be described in detail.

In a first operation ①, the monitoring manager 211*a* may receive the response RP from the non-volatile memory device 220.

In a second operation ②, the monitoring manager 211*a* may generate the first value $x_k$ of the first endurance type ET1, the second value $y_k$ of the second endurance type ET2, and the third value $z_k$ of the third endurance type ET3, based on the response RP.

In a third operation ③, the monitoring manager 211*a* may determine whether the recovery operation is necessary. When it is determined that the second value $y_k$ is greater than or equal to the fourth value $f(x_k)$ obtained by applying the first value $x_k$ to the first threshold function fx, the monitoring manager 211*a* may determine that the recovery operation is required. Additionally or alternatively, when it is determined that the third value $z_k$ is greater than or equal to the fifth value $z(x_k)$ obtained by applying the first value $x_k$ to the second threshold function z(x), the monitoring manager 211*a* may determine that the recovery operation is required.

In a fourth operation ④, the monitoring manager 211*a* may provide the recovery request signal RRS to the recovery manager 211*b*, based on determining that the recovery operation is required.

In a fifth operation ⑤, the recovery manager 211*b* may perform the recovery operation. The recovery manager 211*b* may determine the recovery operation by referring to the recovery action table 213 based on the recovery request signal RRS.

According to an embodiment of the present disclosure, a storage device performing a recovery operation by using endurance data and an operation method thereof are provided.

Also, the damage to endurance of the non-volatile memory device may be prevented preemptively and efficiently by monitoring variables affecting the endurance and/or affected by the endurance, determining whether to perform a recovery operation in consideration of a correlation between the variables, and differently performing the recovery operation depending on a degree to which the monitored variables are out of the correlation. Accordingly, a storage device whose endurance is improved may be provided.

At least one of the components, elements, modules and units (collectively "components" in this paragraph) represented by a block or an equivalent indication in the drawings including FIG. 1 described above may use a direct circuit structure, such as a memory, a processor, a logic circuit, a look-up table, etc. that may execute the respective functions through controls of one or more microprocessors or other control apparatuses. Alternatively or additionally, at least one of these components may be specifically embodied by a module, a program, or a part of code, which is stored in an internal memory of the storage controller 110 or an external memory, and contains one or more executable instructions for performing the above-described functions, and executed by one or more microprocessors or other controller included in the storage controller 110. Further, at least one of these components may include or may be implemented by a processor such as a central processing unit (CPU), graphic processing unit (GPU), another type of microprocessor, or the like in the storage controller 110 that performs the above-described functions. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors.

While the present disclosure has been described with reference to example embodiments thereof, it will be apparent to those of ordinary skill in the art that various changes and modifications may be made thereto without departing from the spirit and scope of the present disclosure as set forth in the following claims and equivalents.

What is claimed is:

1. An operating method of a storage controller configured to communicate with a non-volatile memory device, the method comprising:

receiving a memory response from a non-volatile memory device;

generating a first value of a first endurance type and a second value of a second endurance type, based on the memory response, the first endurance type and the second endurance type being related to an endurance of the non-volatile memory device;

obtaining a third value by applying the first value to a threshold function, wherein the threshold function is defined based on a correlation between the first endurance type and the second endurance type;

determining whether the second value is greater than or equal to the third value; and performing a recovery operation in response to determining that the second value is greater than or equal to the third value, wherein the performing the recovery operation comprises stopping an operation of the non-volatile memory device or controlling the non-volatile memory device to perform only a restricted operation.

2. The method of claim 1, wherein the performing the recovery operation includes:

determining the recovery operation, among a plurality of recovery operations, corresponding to the first endurance type, the second endurance type, and a difference value between the second value and the third value, in response to determining that the second value is greater than or equal to the third value.

3. The method of claim 2, wherein the storage controller is configured to communicate with a host, wherein the determining the recovery operation among the plurality of recovery operations includes:

determining whether the difference value exceeds a threshold value, wherein the threshold value is determined based on a combination of the first endurance type and the second endurance type; and determining a first recovery action as the recovery operation based on the difference value exceeding the threshold value and determining a second recovery action as the recovery operation based on the difference value not exceeding the threshold value.

4. The method of claim 3, wherein the first recovery action comprises stopping the operation of the non-volatile memory device and notifying the host that the operation of the non-volatile memory device is stopped.

5. The method of claim 3, wherein the second recovery action comprises controlling the non-volatile memory device to perform only the restricted operation.

6. The method of claim 5, wherein the restricted operation indicates a read operation.

7. The method of claim 5, wherein the first endurance type corresponds to a time, wherein the second endurance type corresponds to a read count, and wherein the restricted operation indicates an operation of resetting read levels of memory cells of the non-volatile memory device.

8. The method of claim 2, wherein the storage controller includes a recovery action table, wherein the recovery action table includes a plurality of risk levels corresponding to a combination of the first endurance type and the second endurance type, and a plurality of recovery actions respectively corresponding to the plurality of risk levels, the determining the recovery operation among the plurality of recovery operations includes:

obtaining the difference value between the second value and the third value;

determining a target risk level among the plurality of risk levels, based on whether the difference value exceeds a threshold value, wherein the threshold value is determined based on the combination of the first endurance type and the second endurance type; and determining a target recovery action corresponding to the target risk level from among the plurality of recovery actions as the recovery operation, by referring to the recovery action table.

9. The method of claim 1, wherein each of the first endurance type and the second endurance type indicates an event that affects the endurance of the non-volatile memory device and/or an event affected by the endurance, wherein the memory response includes a value of "n" of the first endurance type and a value of "m" of the second endurance type, and wherein each of n and m is 0 or a positive integer.

10. The method of claim 9, wherein the first endurance type and the second endurance type indicate two different ones among an erase count, a read count, a program count, a time, a number of times of reclaim, a number of times of execution of an error correction code, an error correction success step, a number of bad blocks, a program fail count, and an erase fail count.

11. The method of claim 9, wherein the storage controller includes an endurance data table, and wherein the endurance data table includes a first existing value of the first endurance type and a second existing value of the second endurance type.

12. The method of claim 11, wherein the generating the first value and the second value includes:

obtaining the first existing value of the first endurance type and the second existing value of the second endurance type by referring to the endurance data table;

generating the first value of the first endurance type by adding the value of "n" to the first existing value; and generating the second value of the second endurance type by adding the value of "m" to the second existing value.

13. The method of claim 12, wherein the generating the first value and the second value further includes:

updating the endurance data table, based on the first value of the first endurance type and the second value of the second endurance type.

14. The method of claim 1, wherein the first endurance type represents a time, and wherein the second endurance type indicates one of an erase count and a read count.

15. The method of claim 1, wherein the first endurance type indicates one of an erase count and a read count, and wherein the second endurance type indicates one of a program count, a number of times of reclaim, a number of times of execution of an error correction code, an error correction success step, a number of bad blocks, a program fail count, and an erase fail count.

16. An operating method of a storage controller configured to communicate with a non-volatile memory device, the method comprising:

receiving a memory response from a non-volatile memory device;

generating a first value of a first endurance type, a second value of a second endurance type, and a third value of a third endurance type, based on the memory response, the first endurance type, the second endurance type, and the third endurance type being related to an endurance of the non-volatile memory device;

obtaining a fourth value by applying the first value to a first threshold function, wherein the first threshold function is defined based on a correlation between the first endurance type and the second endurance type;

obtaining a fifth value by applying the first value to a second threshold function, wherein the second threshold function is defined based on a correlation between the first endurance type and the third endurance type; and performing a recovery operation, based on at least one of determining that the second value is greater than or equal to the fourth value or determining that the third value is greater than or equal to the fifth value, wherein the performing the recovery operation comprises stopping an operation of the non-volatile memory device or controlling the non-volatile memory device to perform only a restricted operation.

17. The method of claim 16, wherein the performing the recovery operation includes:

determining a first recovery action corresponding to the first endurance type, the second endurance type, and a first difference value between the second value and the fourth value from among a plurality of recovery actions in response to determining that the second value is greater than or equal to the fourth value;

determining a second recovery action corresponding to the first endurance type, the third endurance type, and a second difference value between the third value and the fifth value from among the plurality of recovery actions in response to determining that the third value is greater than or equal to the fifth value; and performing at least one of the first recovery action or the second recovery action as the recovery operation.

18. The method of claim 17, wherein the determining the first recovery action includes:

determining whether the first difference value exceeds a first threshold value, wherein the first threshold value is determined based on a combination of the first endurance type and the second endurance type; and determining a first-type recovery action as the first recovery action based on the first difference value exceeding the first threshold value and determining a second-type recovery action as the first recovery action based on the first difference value not exceeding the first threshold value, and wherein the determining the second recovery action includes:

determining whether the second difference value exceeds a second threshold value, wherein the second threshold value is determined based on a combination of the first endurance type and the third endurance type; and determining the first-type recovery action as the second recovery action based on the second difference value exceeding the second threshold value and determining the second-type recovery action as the second recovery action based on the second difference value not exceeding the second threshold value.

19. The method of claim 16, wherein the first endurance type, the second endurance type, and the third endurance type respectively indicate three different ones among an erase count, a read count, a program count, a time, a number of times of reclaim, a number of times of execution of an error correction code, an error correction success step, a number of bad blocks, a program fail count, and an erase fail count.

20. A storage device comprising:

a non-volatile memory device; and a storage controller, wherein the storage controller is configured to:

receive a memory response from the non-volatile memory device, generate a first value of a first endurance type and a second value of a second endurance type based on the memory response, obtain a third value by applying the first value to a threshold function, and to generate a recovery request signal in response to determining that the second value is greater than or equal to the third value; and perform a recovery operation in response to the recovery request signal, wherein the first endurance type and the second endurance type are related to an endurance of the non-volatile memory device, wherein the threshold function is defined based on a correlation between the first endurance type and the second endurance type, and wherein the recovery operation comprises stopping an operation of the non-volatile memory device or controlling the non-volatile memory device to perform only a restricted operation.

* * * * *